(12) United States Patent
Wu et al.

(10) Patent No.: US 9,466,929 B2
(45) Date of Patent: Oct. 11, 2016

(54) PLUG CONNECTOR WITH FIRMLY FIXED TERMINALS

(71) Applicant: FOXCONN INTERCONNECT TECHNOLOGY LIMITED, Grand Cayman (KY)

(72) Inventors: Jerry Wu, Irvine, CA (US); Jun Chen, Kunshan (CN); Fan-Bo Meng, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 80 days.

(21) Appl. No.: 14/567,405

(22) Filed: Dec. 11, 2014

(65) Prior Publication Data

US 2015/0162701 A1    Jun. 11, 2015

(30) Foreign Application Priority Data

Dec. 11, 2013  (CN) .......................... 2013 1 0665176
Dec. 11, 2013  (CN) .......................... 2013 1 0665953

(51) Int. Cl.
*H01R 24/00* (2011.01)
*H01R 24/60* (2011.01)
*H05K 1/11* (2006.01)
(Continued)

(52) U.S. Cl.
CPC .............. *H01R 24/60* (2013.01); *H01R 23/02* (2013.01); *H05K 1/117* (2013.01); *H01R 9/038* (2013.01); *H01R 12/53* (2013.01);
(Continued)

(58) Field of Classification Search
CPC ...... H01R 9/038; H01R 12/53; H01R 13/74; H01R 13/652; H01R 13/6485; H01R 23/02; H01R 43/24; H05K 1/117; H05K 2201/1031; H05K 2203/1327; Y02P 70/611
USPC .......................... 439/606, 101, 108, 660, 951
See application file for complete search history.

(56) References Cited

U.S. PATENT DOCUMENTS 7,179,115 B2 *  2/2007  Hashim .................. H05K 1/117
                                                      439/404
7,872,873 B2    1/2011  Hiew et al.
(Continued)

FOREIGN PATENT DOCUMENTS

CN          201207460 Y      3/2009
CN          202737152 U      2/2013
(Continued)

*Primary Examiner* — Neil Abrams
*Assistant Examiner* — Travis Chambers
(74) *Attorney, Agent, or Firm* — Ming Chieh Chang; Wei Te Chung

(57) ABSTRACT

A plug connector for mating with a mating connector, including: a housing, a printed circuit board (PCB) received in the housing, a number of terminals, and an insulative cover portion molded to the PCB. The PCB includes a plurality of conductive paths, an upper surface, an opposite lower surface, and a pair of side surfaces. A number of conductive pads are disposed on the upper surface and the lower surface. The conductive pads are connected with corresponding conductive paths. The terminals are electrically connected with corresponding conductive pads of the PCB. The terminals include a number of first terminals disposed on the upper surface and the lower surface of the PCB and a number of second terminals disposed on the side surfaces of the PCB. The insulative cover portion covers the PCB while exposing each of the terminals out partly for mating with the mating connector.

20 Claims, 11 Drawing Sheets

(51) Int. Cl.
*H01R 9/03* (2006.01)
*H01R 12/53* (2011.01)
(52) U.S. Cl.
CPC ............... *H05K 2201/1031* (2013.01); *H05K 2203/1327* (2013.01); *Y02P 70/611* (2015.11)

(56) References Cited

U.S. PATENT DOCUMENTS

| | | | |
|---|---|---|---|
| 8,461,465 B2 | 6/2013 | Golko et al. | |
| 8,647,156 B2 | 2/2014 | Golko et al. | |
| 8,724,281 B2* | 5/2014 | Mullins | H01R 13/641 361/93.9 |
| 8,747,155 B2* | 6/2014 | Weber | H01R 43/24 439/589 |
| 8,777,666 B2 | 7/2014 | Golko et al. | |
| 8,794,981 B1* | 8/2014 | Rodriguez | H01R 13/405 439/606 |
| 8,920,197 B2* | 12/2014 | Tziviskos | H01R 13/405 439/660 |
| 9,147,975 B2* | 9/2015 | Shiratori | H01R 13/6471 |
| 2014/0069709 A1 | 3/2014 | Schmidt et al. | |

FOREIGN PATENT DOCUMENTS

| | | |
|---|---|---|
| CN | 203014076 U | 6/2013 |
| CN | 103326157 A | 9/2013 |

* cited by examiner ated Jun. 11, 2013, discloses a plug connector. Contacts of the plug connector are formed from a flex circuit upon which contact pucks are attached. Pucks can be made from a variety of conductive materials. Pucks can be cut to size in a stamping or similar process from a metal sheet and can be attached to the flex circuit using surface mount technology (SMT). In a separate step, ground ring can be secured to the body of the connector.

PLUG CONNECTOR WITH FIRMLY FIXED TERMINALS

BACKGROUND OF THE INVENTION

1. Field of the Invention

The present invention relates to a plug connector, and particularly related to the copending application Ser. No. 14/477,889 filed Sep. 5, 2014.

2. Description of Related Art

U.S. Pat. No. 8,461,465, issued on Jun. 11, 2013, discloses a plug connector. Contacts of the plug connector are formed from a flex circuit upon which contact pucks are attached. Pucks can be made from a variety of conductive materials. Pucks can be cut to size in a stamping or similar process from a metal sheet and can be attached to the flex circuit using surface mount technology (SMT). In a separate step, ground ring can be secured to the body of the connector.

U.S. Pat. No. 7,872,873, issued on Jan. 18, 2011, discloses an extended USB (universal serial bus) device manufactured by forming a contact spring assembly in which contact springs are mounted on a base (e.g., a PCB or plastic) substrate, and spring assembly is then mounted onto a PCB such that a contact portion of each contact spring protrudes through corresponding openings on the PCB, whereby the substrate covers the openings during a subsequent plastic molding step of forming a single-piece molded housing.

An improved plug connector is desired to offer advantages over the related art.

SUMMARY OF THE INVENTION

An object of the present invention is to provide a plug connector having terminals firmly fixed in position and wear-resisting.

To achieve the above-mentioned object, a plug connector for mating with a mating connector comprises: a housing; a printed circuit board (PCB) received in the housing, the PCB comprising a plurality of conductive paths, an upper surface, an opposite lower surface, a pair of side surfaces connecting the upper surface and the lower surface, and a plurality of conductive pads disposed on the upper surface and the lower surface, the conductive pads connected with corresponding conductive paths; a plurality of terminals electrically connected with corresponding conductive pads of the PCB, the terminals comprising a plurality of first terminals disposed on the upper surface and the lower surface of the PCB and a plurality of second terminals disposed on the side surfaces of the PCB; and an insulative cover portion molded to the PCB, the insulative cover portion covering the PCB and exposing each of the terminals out partly for mating with the mating connector.

According to the present invention, the terminals of the plug connector projecting outwardly for mating with the mating connector can still make good electrical connection even after repeated use. In addition, the plug connector of the present invention can effectively ensure relative positions of the terminals, which is also beneficial to molding of the housing on the PCB.

DETAILED DESCRIPTION OF THE PREFERRED EMBODIMENT

Figure 1:
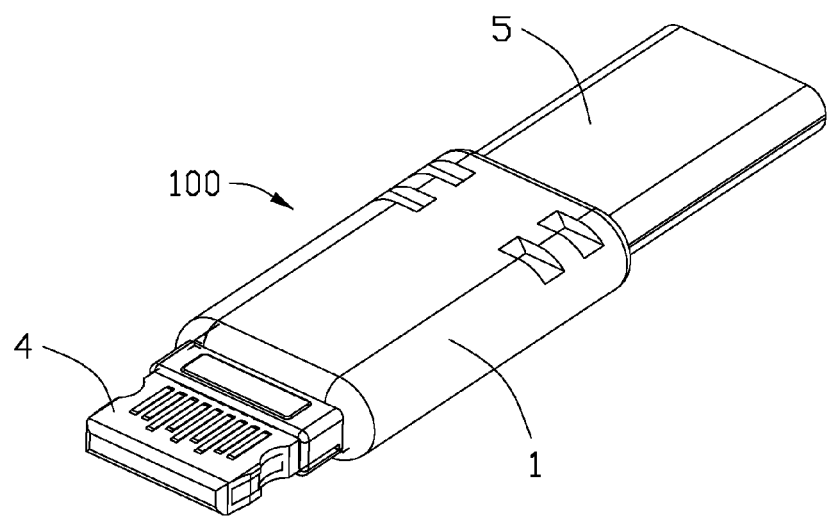
FIG. 1 is a perspective view of a plug connector in accordance with the present invention.
Figure 2:
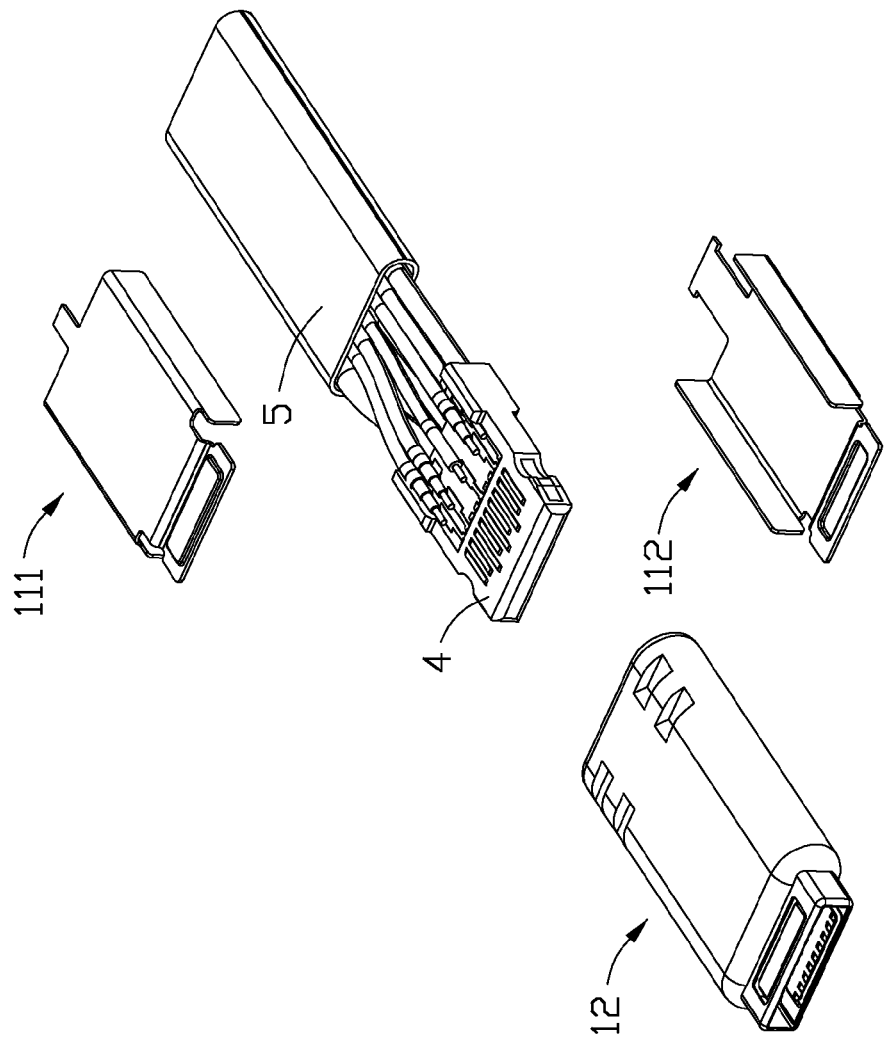
FIG. 2 is a partly exploded view of the plug connector as shown in FIG. 1.
Figure 3:
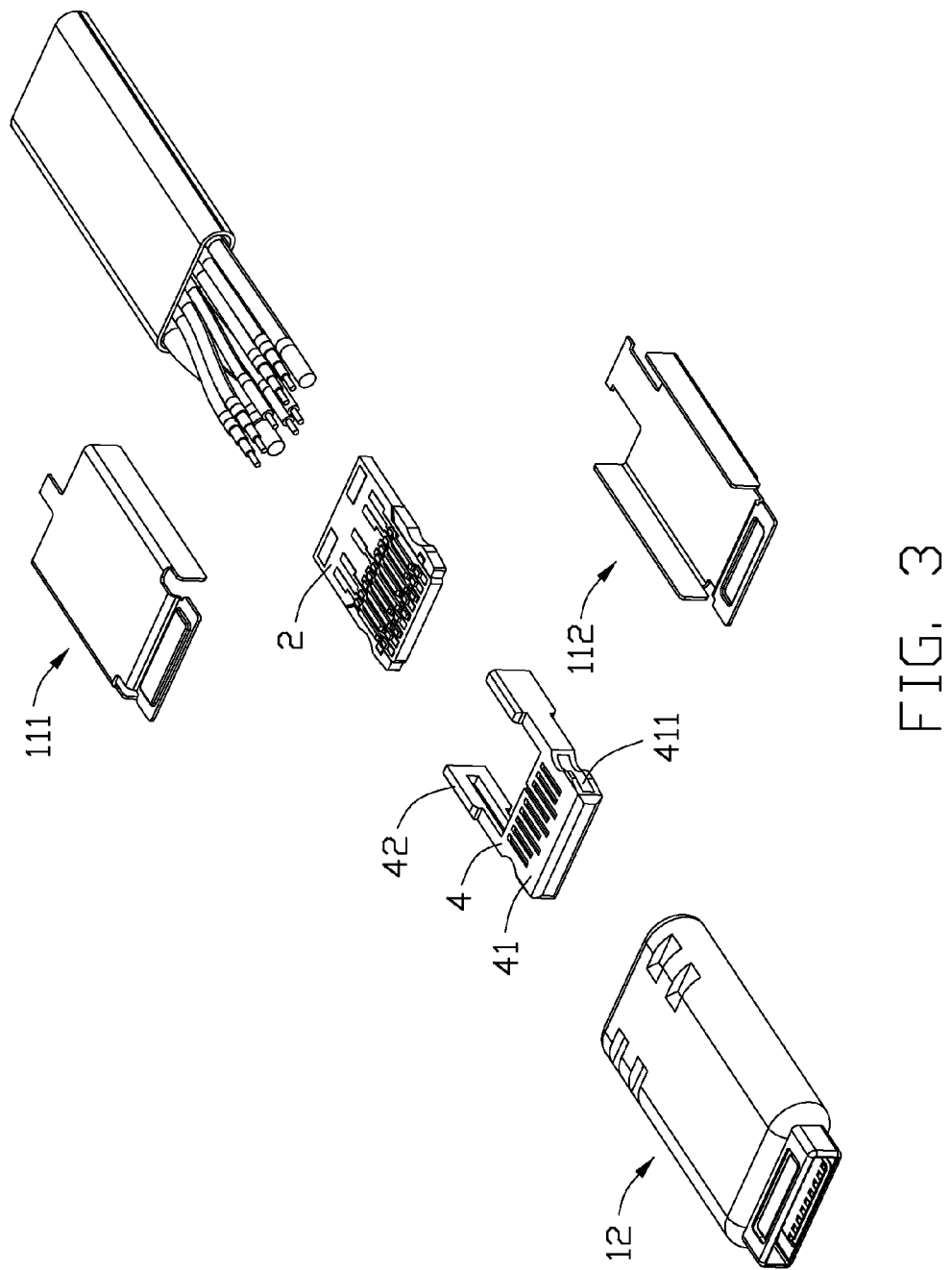
FIG. 3 is a partly exploded view of the plug connector in a first embodiment as shown in FIG. 1.
Figure 4:
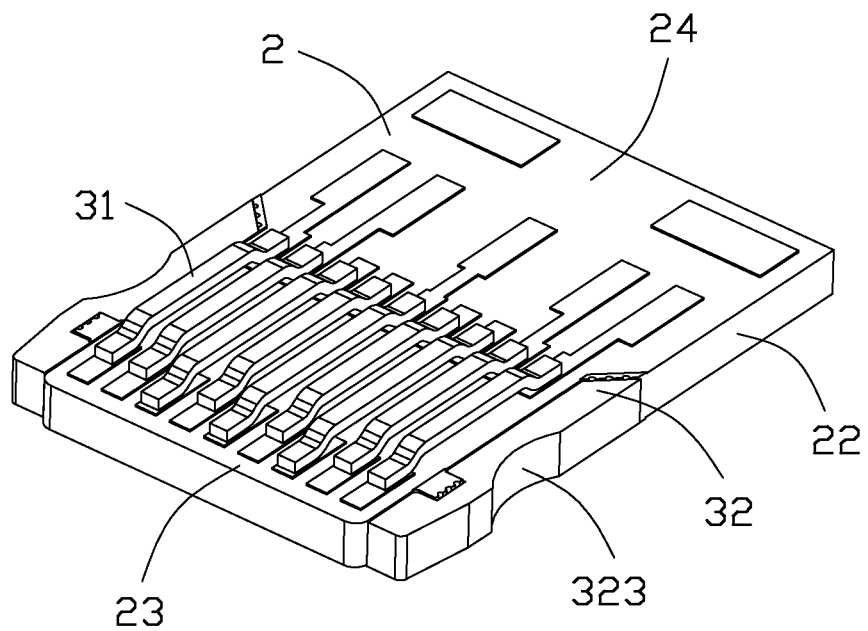
FIG. 4 is a perspective view of a printed circuit board and terminals of the plug connector as shown in FIG. 3.
Figure 5:
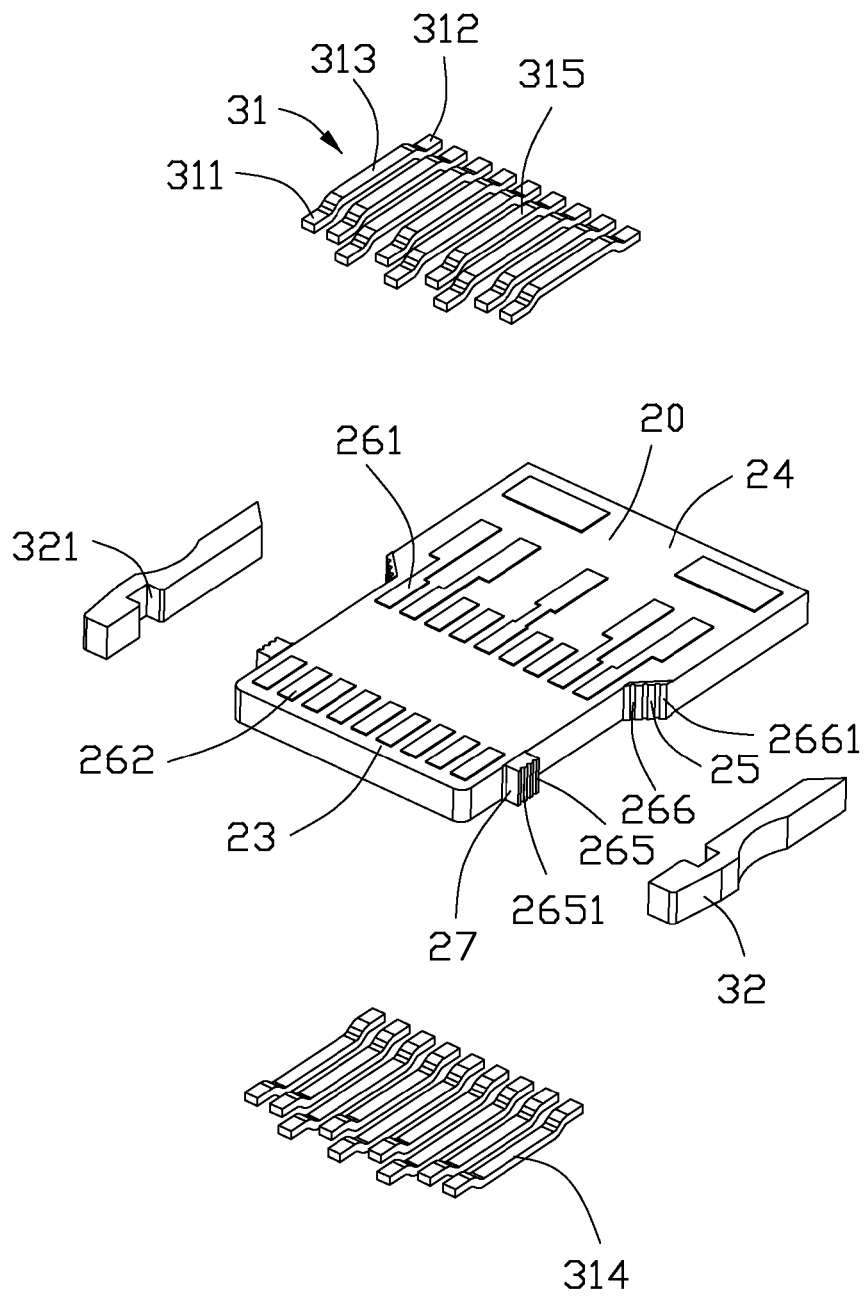
FIG. 5 is an exploded view of the printed circuit board and terminals of the plug connector as shown in FIG. 4.
Figure 6:
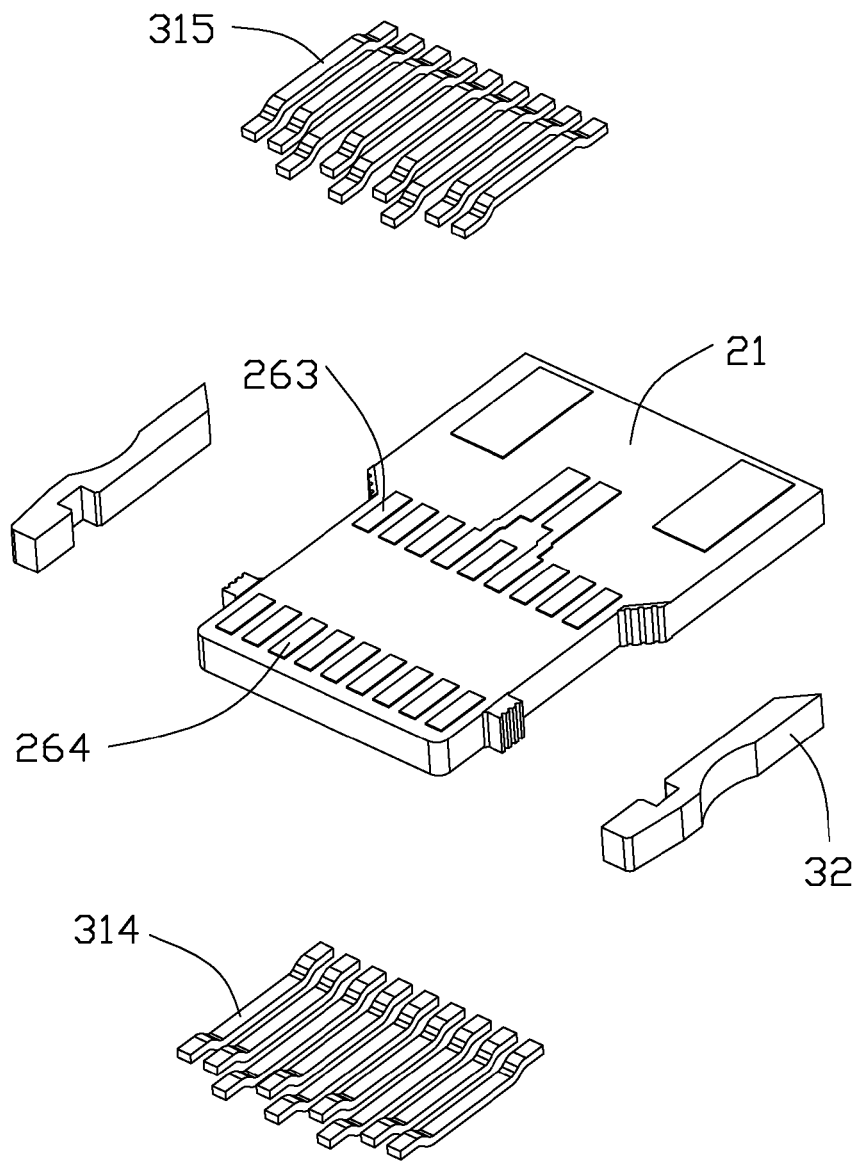
FIG. 6 is another exploded view of the printed circuit board and terminals of the plug connector as shown in FIG. 5.

Reference will now be made in detail to some preferred embodiments of the present invention.

Referring to FIGS. 1 to 11, a plug connector 100 mated with a mating connector comprises a housing 1, a printed circuit board (PCB) 2 received in the housing 1, a plurality of terminals 3 electrically connected with the PCB 2, and an insulative cover portion 4 molded covering the PCB 2. An end of the plug connector 100 is connected with a cable 5. The PCB 2 comprises an upper surface 20, a lower surface 21 opposite to the upper surface 20, and a pair of side surfaces 22 connecting the upper surface 20 and the lower surface 21. The terminals 3 comprise a plurality of first terminals 31 disposed on the upper surface 20 and the lower surface 21 of the PCB 2, and a plurality of second terminals 32 disposed on the side surfaces 22 of the PCB 2. The first terminals 31 disposed on the upper surface 20 are central symmetrical to the first terminals 31 disposed on the lower surface 21. The second terminals 32 are symmetrically set on the pair of the side surfaces 22. The plug connector 100 can be inserted into the mating connector in a first direction or a second direction. In this embodiment, the second terminal 32 is a power terminal.

The PCB 2 has a plurality of conductive paths. The PCB 2 comprises a front portion 23, a rear portion 24 with the larger width than the front portion 23, and a step portion 25 formed between the front portion 23 and the rear portion 24. When the plug connector 100 is inserted into the mating connector, the front portion 23 enters into the mating connector firstly. The PCB 2 comprises a plurality of conductive pads. The conductive pads comprise a plurality of first conductive pads 261 spaced apart from each other on the upper surface 20, a plurality of third conductive pad 263 spaced apart from each other on the lower surface 21. The first conductive pads 261 and the third conductive pad 263 are electrically connected with the corresponding conductive paths, respectively. The conductive path connected with the first conductive pad 261 is connected to the corresponding conductive path connected with the third conductive pad 263. The first conductive pad 261 and the third conductive pad 263 are aligned one by one in the vertical direction.

The conductive pads further comprise a pair of front pads 265 disposed on the side surfaces 22 of the PCB 2 respectively and a pair of rear pads 266 spaced apart from the front pad 265 respectively. The PCB 2 comprises a lug 27 projecting outwardly from the side surface 22 of the front portion 23. The front pad 265 is disposed on the lug 27. The rear pad 266 is disposed on the step portion 25. The front pad 265 comprises at least one slot 2651 to increase the soldering area of the second terminals 32 with the front pad 265, and the rear pad 266 comprises at least one slot 2661 to increase the soldering area of the second terminals 32 with the rear pad 266. In this invention, a plurality of slots 2651 are disposed the front pad 265 making the surface of the front pad 265 showing wavy. The structure of the rear pad 266 is same as the structure of the front pad 265. The wavy surface can increase the soldering area and accommodate more tin solder. The second terminals 32 will be fixed more firmly.

Each first terminal 31 comprises a first portion 311, a second portion 312, and a mating portion 313 connecting the first portion 311 and the second portion 312. The second portion 312 of each first terminal is fixed on the PCB 2 and electrically connected with the corresponding conductive path. The mating portion 313 exposes out of the insulative cover portion 4 for mating with the mating connector. Each first terminal 31 comprises a bottom wall 314 closed to the PCB 2 and a top wall 315 far away from the PCB 2. A distance from the top wall 315 of the mating portion 313 of the first terminals 31 to the PCB 2 is larger than the distance from the top wall 315 of the first portion 311 of the first terminals 31 to the PCB 2. The distance from the top wall 315 of the mating portion 313 of the first terminals 31 to the PCB 2 is larger than the distance from the top wall 315 of the second portion 312 of the first terminals 31 to the PCB 2. The mating portion 313 projecting upwardly makes the wear resistance of the first terminals 31 increasing. It can guarantee the electrical connection between the plug connector 100 and the mating connector.

The second terminals 32 expose out of the insulative cover portion 4 partly for mating with the mating connector. The pair of the second terminals 32 have the same structure and soldered on the side walls 22 of the PCB 2 respectively. The second terminals 32 are disposed on the front portion 23 and the step portion 25 and soldered with the front pad 265 and the rear pad 266. When the second terminals 32 are soldered on the front portion 23 of the PCB 2, the width of the front portion 23 and the second terminals 32 is equal to the width of the rear portion 24. The second terminal 32 comprises a groove 321 recessing inwardly to receive the lug 27. An outer surface of the second terminal 32 recesses toward the PCB 2 to form a curved area 323 exposed out of the insulative cover portion 4. When the plug connector 100 is mated with the mating connector, the curved area 323 will latch with the mating connector. The slot 2651 makes the soldering area of the second terminal 32 with the front pad 265 increasing and the second terminals 32 and makes the PCB 2 and the second terminals 32 more stable.

Referring to FIGS. 3 to 6, in a first embodiment of the invention, the conductive pads comprise a plurality of second conductive pads 262 spaced apart from and parallel to the first conductive pads 261 on the upper surface 20 of the PCB 2. The second conductive pad 262 and the first conductive pad 261 are aligned one by one in the mating direction. The conductive pads comprise a plurality of fourth conductive pads 264 spaced apart from and parallel to the third conductive pads 263 on the lower surface 21 of the PCB 2. The fourth conductive pad 264 and the third conductive pad 263 are aligned one by one in the mating direction. The second portion 312 of the first terminals 31 on the upper surface 20 are soldered with the corresponding first conductive pads 261, and the first portion 311 are soldered with the corresponding second conductive pads 262. The second portion 312 of the first terminals 31 on the lower surface 21 are soldered with the corresponding third conductive pads 263, and the first portion 311 are soldered with the corresponding fourth conductive pads 264. The first terminals 31 are arched.

Figure 7:
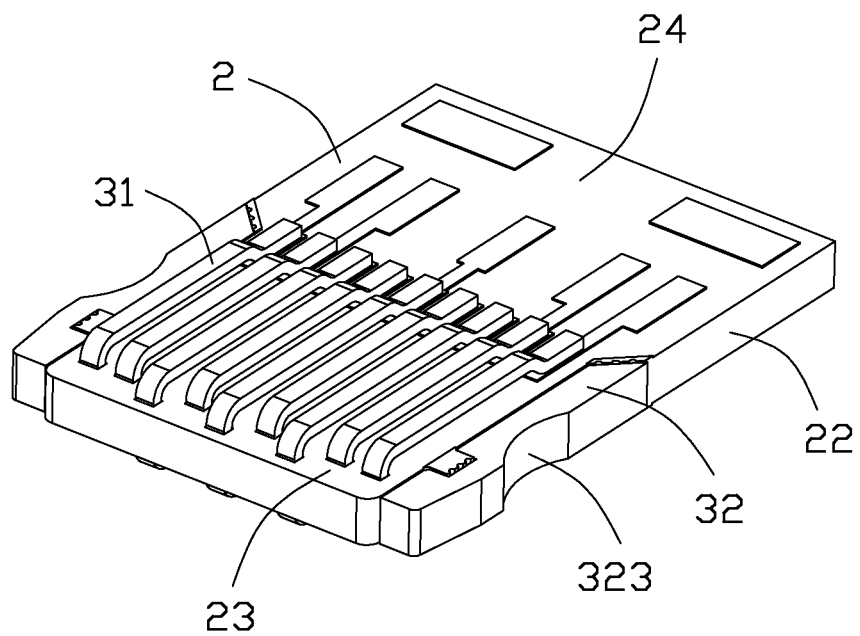
FIG. 7 is a perspective view of the printed circuit board of the plug connector in a second embodiment as shown in FIG. 1.
Figure 8:
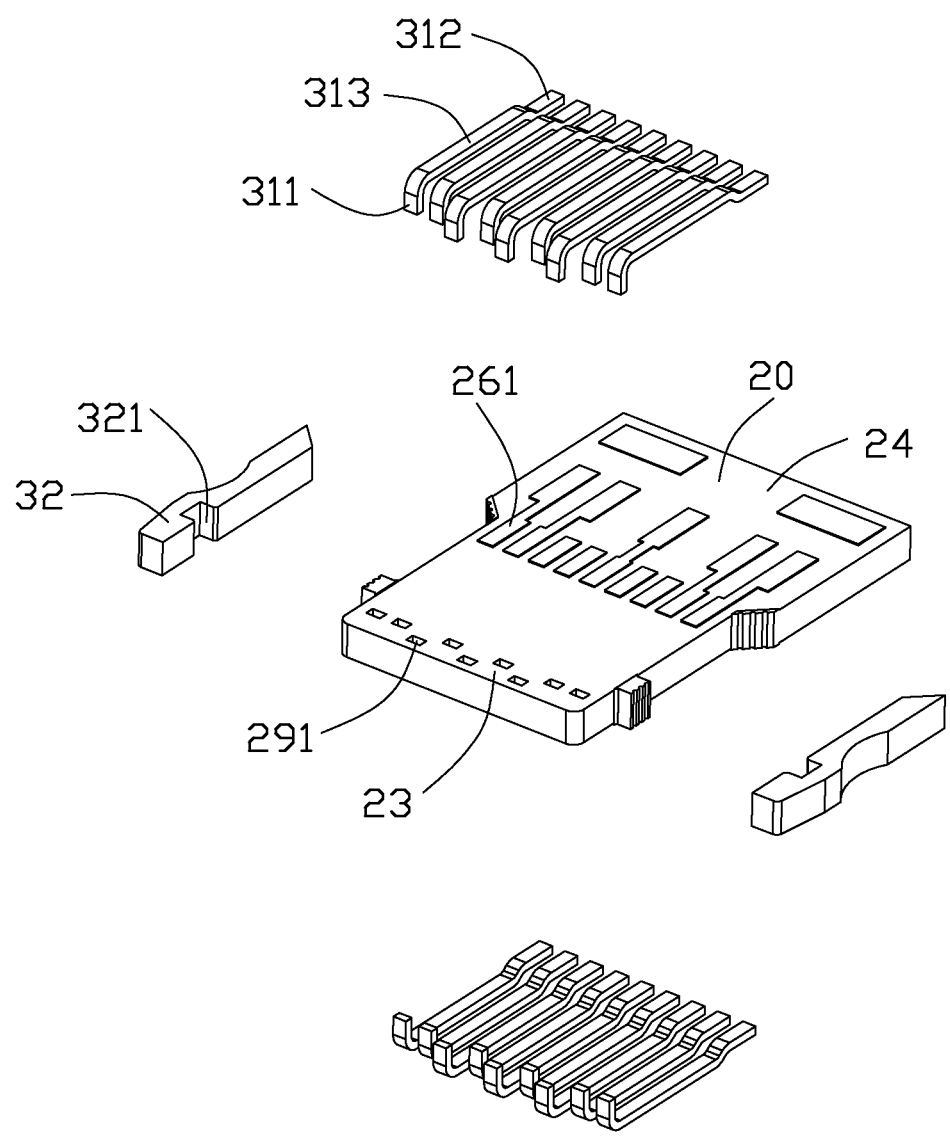
FIG. 8 is an exploded view of the printed circuit board and terminals of the plug connector as shown in FIG. 7.
Figure 9:
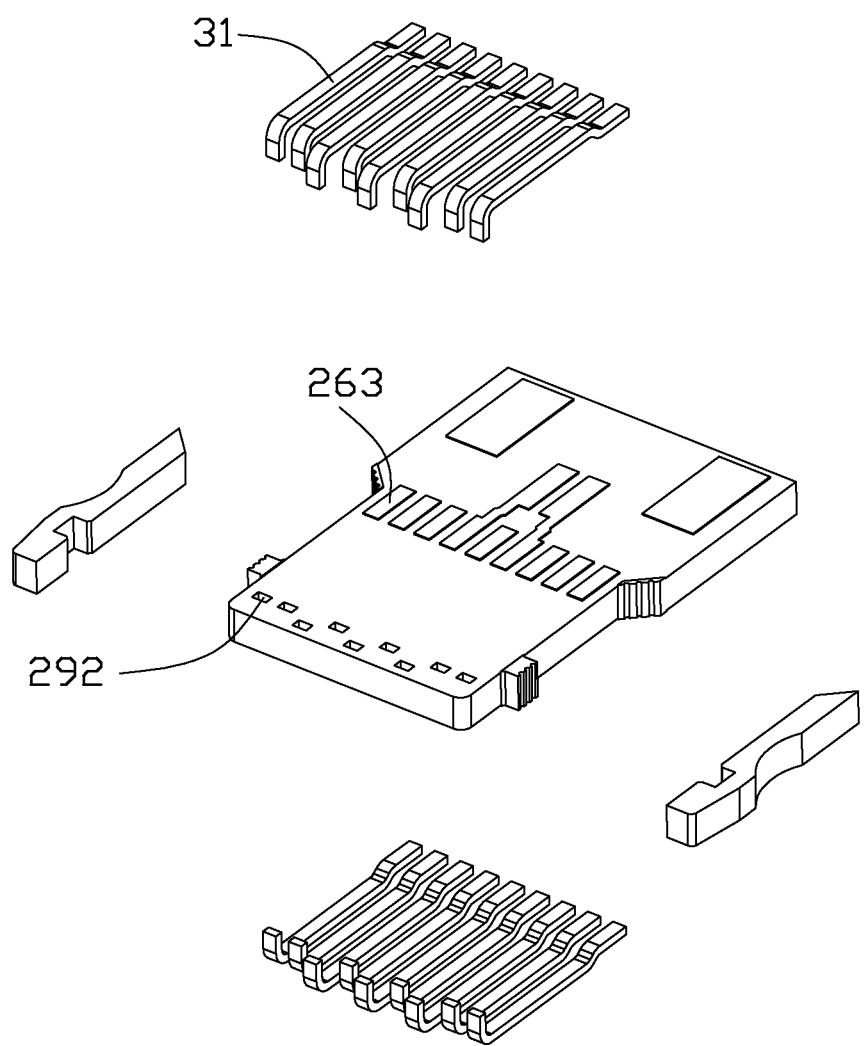
FIG. 9 is another exploded view of the printed circuit board and terminals of the plug connector as shown in FIG. 8.

Referring to FIGS. 7 to 9, in a second embodiment of the invention, the PCB 2 comprises a plurality of first positioning holes 291 spaced apart from the first conductive pads 261 on the upper surface 20. Each first positioning hole 291 and the corresponding first conductive pad 261 are aligned one by one in the mating direction. The first portion 311 of the first terminal 31 is vertical to the mating portion 313 of the first terminal 31 and is mounted in the first positioning holes 291. The PCB 2 comprises a plurality of second positioning holes 292 spaced apart from the third conductive pads 263 on the lower surface 21. Each second positioning hole 292 and the corresponding third conductive pad 263 are aligned one by one in the mating direction. The first portion 311 of the first terminal 31 is vertical to the mating portion 313 of the first terminal 31 and is mounted in the second positioning holes 292.

The first positioning holes 291 can be communicated or not communicated with the second positioning holes 292. When the first positioning holes 291 are not communicated with the second positioning holes 292, the first portion 311 of the first terminals 31 mounted on the upper surface 20 are disposed in the first positioning holes 291 and resisted against the PCB 2, and the first portion 311 of the first terminals 31 mounted on the lower surface 21 are disposed in the second positioning holes 292 and resisted against the PCB 2. The first terminals 31 on the upper surface 20 are not directly contacted to the first terminals 31 on the lower surface 21. When the first positioning holes 291 are communicated with the second positioning holes 292, the first portion 311 of the first terminals 31 on the upper surface 20 are resisted against the first portion 311 of the first terminals 31 on the lower surface 21. When assembled, mount the first portion 311 of the first terminal 31 into the first positioning hole 291 on the upper surface 20, and solder the second portion 312 with the first conductive pad 261. Mount the first portion 311 of the first terminal 31 into the second positioning hole 292 on the lower surface 21, and solder the second portion 312 with the third conductive pad 263.

Figure 10:
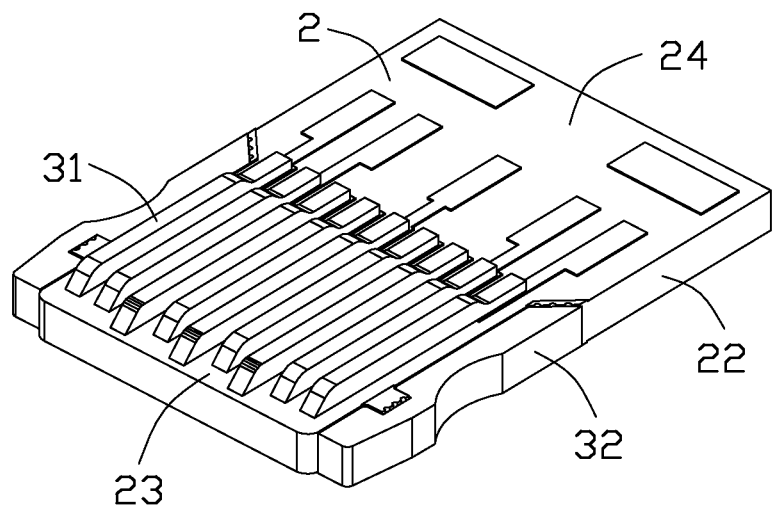
FIG. 10 is a perspective view of the printed circuit board of the plug connector in a third embodiment as shown in FIG. 1.
Figure 11:
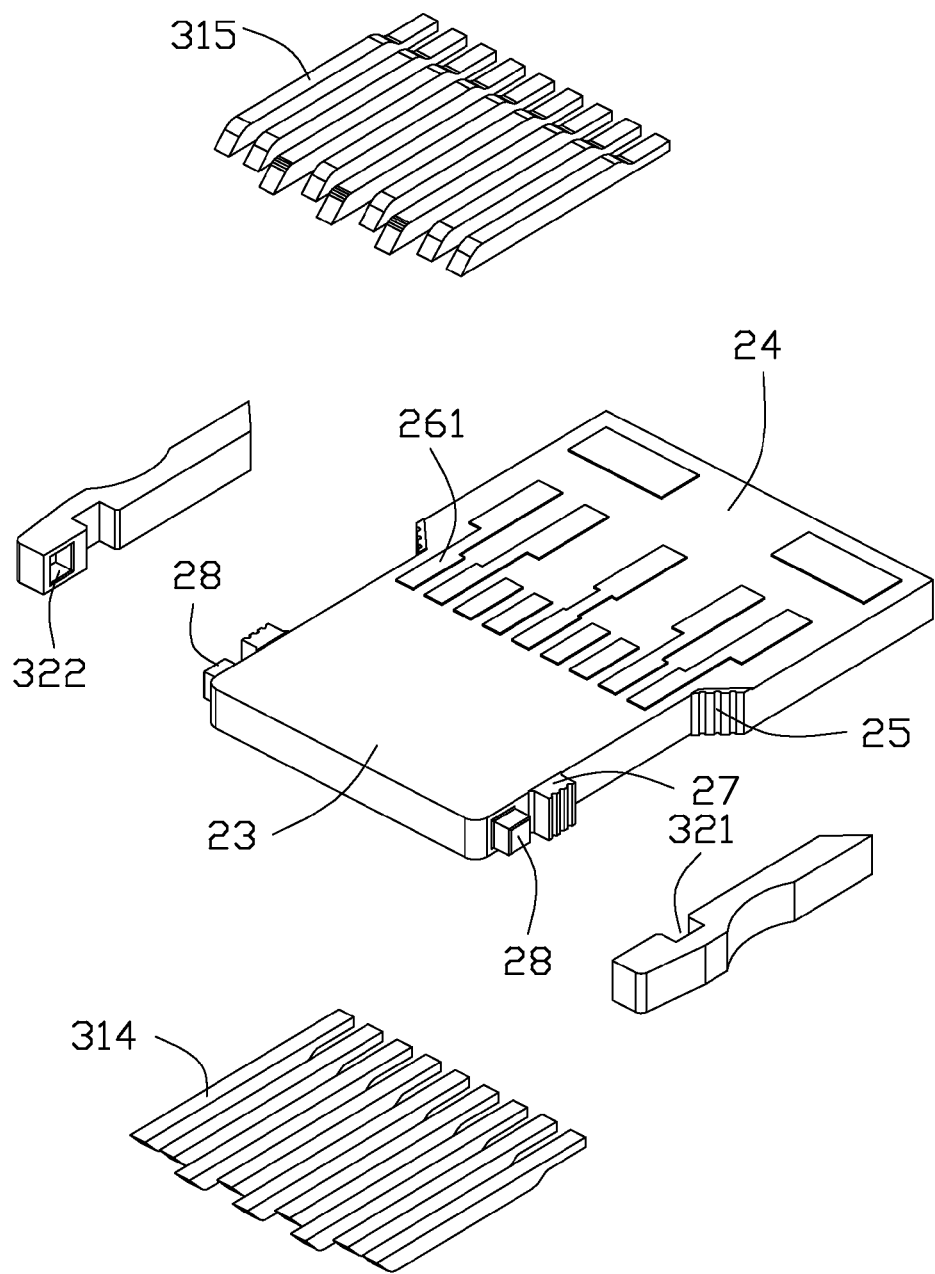
FIG. 11 is an exploded view of the printed circuit board and terminals of the plug connector as shown in FIG. 10.

Referring to FIGS. 10 to 11, in a third embodiment of the invention, the bottom wall 314 of the first portion 311 of the first terminal 31, the bottom wall 314 of the second portion 312, and the bottom wall 314 of the mating portion 313 are on one horizontal plane. When the first terminal 31 is soldered on the PCB 2, the bottom wall 314 of the first terminal 31 is fit with the surface of the PCB 2. The PCB 2 comprises a positioning block 28 projecting outwardly from the side surface 22 of the front portion 23. The second terminal 32 comprises a positioning slot 322 mating with the positioning block 28. In the other embodiment, the PCB 2 can form the positioning slot 322, and the second terminal 32 can form the positioning block 28 mating with the positioning slot 322. It is convenient to solder the second terminal 32 after fixing the positioning slot 322 and the positioning block 28.

The insulative cover portion 4 is molded on the PCB 2. The first terminals 31 expose out of the insulative cover portion 4 partly for mating with the mating connector. The insulative cover portion 4 comprises a main portion 41 covering the first terminals 31 and a pair of side arms 42 extending opposite to the mating direction from two sides of the main portion 41. The pair of the side arms 42 cover the side surfaces 22 of the PCB 2. The main portion 4 comprises a opening 411 to make the second terminal 32 can be exposed out of the main portion 4 partly to form the electrical connection.

The housing 1 comprises an upper housing 111, a lower housing 112 mating with the upper housing 111, and an outer housing 12 covering the upper housing 111 and the lower housing 112.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A plug connector for mating with a mating connector, comprising:
    a housing;
    a printed circuit board (PCB) received in the housing, the PCB comprising a plurality of conductive paths, an upper surface, an opposite lower surface, a pair of side surfaces connecting the upper surface and the lower surface, and a plurality of conductive pads disposed on the upper surface and the lower surface, the conductive pads connected with corresponding conductive paths;
    a plurality of terminals electrically connected with corresponding conductive pads of the PCB, the terminals comprising a plurality of first terminals disposed on the upper surface and the lower surface of the PCB and a plurality of second terminals disposed on the side surfaces of the PCB; and
    an insulative cover portion molded to the PCB, the insulative cover portion covering the PCB and exposing each of the terminals out partly for mating with the mating connector.

2. The plug connector as recited in claim 1, wherein an outer surface of the second terminal recesses toward the PCB to form a curved area exposed out of the insulative cover portion, when the plug connector is mated with the mating connector, the curved area latching with the mating connector.

3. The plug connector as recited in claim 1, wherein each first terminal comprising a first portion, a second portion and a mating portion connecting the first portion and the second portion, at least one portion of the first portion or the second portion fixed on the PCB, the mating portion exposed out of the insulative cover portion partly for mating with the mating connector.

4. The plug connector as recited in claim 3, wherein the conductive pads comprise a plurality of first conductive pads spaced apart from each other on the upper surface and a plurality of second conductive pads spaced apart from and parallel to the first conductive pads, the first conductive pad electrically connected with the corresponding conductive path, the second portion of the first terminals soldered with the corresponding first conductive pads, the first portion of the first terminals soldered with the second conductive pads.

5. The plug connector as recited in claim 4, wherein the conductive pads comprise a plurality of third conductive pads on the lower surface and a plurality of fourth conductive pads spaced apart from and parallel to the third conductive pads, the second portion of the first terminals soldered with the third conductive pads, the first portion of the first terminals soldered with the fourth conductive pads.

6. The plug connector as recited in claim 4, wherein a plurality of first positioning holes are spaced apart from the first conductive pads on the upper surface of the PCB, the first portion of the first terminal vertical to the mating portion and mounted in the first positioning holes.

7. The plug connector as recited in claim 6, wherein the conductive pads comprise a plurality of third conductive pads on the lower surface of the PCB and a plurality of second positioning holes spaced apart from the third conductive pads, the second portion of the first terminals soldered with the third conductive pads on the lower surface, the first portion of the first terminal vertical to the mating portion and mounted in the second positioning holes.

8. The plug connector as recited in claim 7, wherein the first portion of the first terminals mounted on the upper surface are disposed in the first positioning holes and resisted against the PCB, the first portion of the first terminals mounted on the lower surface disposed in the second positioning holes and resisted against the PCB, the first terminals on the upper surface insulated to the first terminals on the lower surface.

9. The plug connector as recited in claim 7, wherein the first positioning holes are communicated with the second positioning holes, the first portion of the first terminals on the upper surface resisted against the first portion of the first terminals on the lower surface.

10. The plug connector as recited in claim 9, wherein the PCB comprises a front portion, a rear portion with the larger width than the front portion, and a step portion formed between the front portion and the rear portion, when the plug connector is inserted into the mating connector, the front portion entering into the mating connector firstly.

11. The plug connector as recited in claim 10, wherein the front pad and the rear pad comprises at least one slot respectively to increase the soldering area of the second terminal with the front pad and the rear pad.

12. The plug connector as recited in claim 10, wherein the PCB comprises a positioning block projecting outwardly from the side surface of the front portion, the second terminal comprising a positioning slot mating with the positioning block.

13. The plug connector as recited in claim 10, wherein the conductive pads comprise a pair of a front pads and a pair of rear pads soldered with the second terminals, the front pads disposed on the side surfaces of the front portion and the rear pad disposed on the side surfaces of the step portion.

14. The plug connector as recited in claim 13, wherein the PCB comprises a lug projecting outwardly from the side surface of the front portion, the front pad disposed on the lug, the second terminal comprising a groove recessing inwardly to receive the lug.

15. An electrical connector comprising a rigid printed circuit board;
    a plurality of conductive pads formed on a surface of the printed circuit board;
    a plurality of first stationary contacts fixed upon the surface of the printed circuit board and mechanically and electrically connected to the conductive pads, respectively;
    a pair of second stationary contacts fixed upon a pair of opposite side edges of the printed circuit board;
    an insulative cover portion molded upon the printed circuit board and the associated first stationary contacts and second stationary contacts while exposing said first stationary contacts and said second stationary contacts partially; and means for interlocking the printed circuit board and the corresponding second stationary contact for restricting relative movement of the second stationary contact with regard to the printed circuit board in at least one of a front-to-back direction and a vertical direction perpendicular to each other, before the insulative cover is molded upon the printed circuit board.

16. The electrical connector as claimed in claim 15, wherein said means includes a positioning block located upon one of the second stationary contact and the side edge of the printed circuit board, and a positioning slot in the other.

17. The electrical connector as claimed in claim 15, where each of said second stationary contacts forms an exposed notch.

18. The electrical connector as claimed in claim 15, wherein a pair of conductive pads are formed on the side edges, respectively, on which the pair of second stationary contacts are soldered.

19. An electrical connector comprising:
a rigid printed circuit board;
a plurality of conductive pads formed on a surface of the printed circuit board;
a plurality of first stationary contacts fixed upon the surface of the printed circuit board and mechanically and electrically connected to the conductive pads, respectively;
a pair of second stationary contacts fixed upon a pair of opposite side edges of the printed circuit board;
an insulative cover portion molded upon the printed circuit board and the associated first stationary contacts and second stationary contacts while exposing said first stationary contacts and said second stationary contacts partially; wherein
a pair of conductive pads are formed on the side edges, on which the pair of second stationary contacts are soldered, respectively.

20. The electrical connector as claimed in claim 19, further including means for interlocking the printed circuit board and the corresponding second stationary contact for restricting relative movement of the second stationary contact with regard to the printed circuit board in both a front-to-back direction and a vertical direction perpendicular to each other, before the insulative cover is molded upon the printed circuit board.

* * * * *